US009341655B2

(12) United States Patent
Muench et al.

(10) Patent No.: US 9,341,655 B2
(45) Date of Patent: May 17, 2016

(54) CHARGE PUMP GENERATOR WITH DIRECT VOLTAGE SENSOR

(71) Applicant: GLOBALFOUNDRIES INC., Grand Cayman (KY)

(72) Inventors: Paul D. Muench, Poughkeepsie, NY (US); Donald W. Plass, Poughkeepsie, NY (US); Michael A. Sperling, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/501,587

(22) Filed: Sep. 30, 2014

(65) Prior Publication Data

US 2015/0054572 A1 Feb. 26, 2015

Related U.S. Application Data

(63) Continuation of application No. 13/975,904, filed on Aug. 26, 2013.

(51) Int. Cl.
*G11C 16/30* (2006.01)
*H02M 3/07* (2006.01)
*G01R 19/00* (2006.01)
*G05F 1/00* (2006.01)
*G06F 1/26* (2006.01)
*G06F 1/30* (2006.01)

(52) U.S. Cl.
CPC .............. *G01R 19/0023* (2013.01); *G05F 1/00* (2013.01); *G06F 1/26* (2013.01); *G06F 1/30* (2013.01); *H02M 3/07* (2013.01)

(58) Field of Classification Search
CPC ................. H02M 3/07; H02M 3/073; H02M 2001/0025; G11C 5/145; G11C 16/30
USPC ...................... 324/123; 327/534, 536; 365/226
See application file for complete search history.

(56) References Cited

U.S. PATENT DOCUMENTS

| 6,107,862 A | 8/2000 | Mukainakano et al. |
| 6,169,428 B1 * | 1/2001 | Mader ................ G01R 19/0084 327/101 |
| 6,317,374 B2 | 11/2001 | Feurle |
| 6,618,296 B2 * | 9/2003 | Zhang ..................... H02M 3/07 365/149 |

(Continued)

FOREIGN PATENT DOCUMENTS

| EP | 1492218 B1 | 3/2006 |
| JP | 2001111419 A | 4/2001 |

*Primary Examiner* — Arleen M Vazquez
*Assistant Examiner* — Akm Zakaria
(74) *Attorney, Agent, or Firm* — Michael J. LeStrange, Esq.

(57) ABSTRACT

A method for operating a charge pump that supplies switching current for a plurality of transistors includes a capacitor generating a pumped voltage. A comparator generates a pump control signal for turning on and off charging of the pump capacitor based on a difference between a comparison voltage and a reference voltage. A direct voltage sensor receives a feedback signal reflecting the pumped voltage and generates the comparison voltage in response to the feedback signal. The sensor includes a sensor resistor, a current source configured to drive a sensor current through the sensor resistor, and a differential op-amp that drives the sensor current to cause the voltage drop across the sensor resistor to remain constant as the pumped voltage experiences the voltage drop. The charge pump may include two similar direct voltage sensor controlling positive and negative pumped voltages.

8 Claims, 6 Drawing Sheets

(56) References Cited

U.S. PATENT DOCUMENTS

| | | |
|---|---|---|
| 6,859,091 B1 | 2/2005 | Nicholson et al. |
| 6,901,009 B2 | 5/2005 | Natori |
| 7,038,945 B2 | 5/2006 | Kessenich |
| 7,215,181 B2 | 5/2007 | Hahn et al. |
| 7,403,405 B2 | 7/2008 | Conte et al. |
| 7,449,929 B2 | 11/2008 | Dykstra |
| 7,692,480 B2 | 4/2010 | Gebara et al. |
| 7,746,160 B1 * | 6/2010 | Raghavan ............... G05F 3/205 327/534 |
| 7,772,918 B2 | 8/2010 | Fifield et al. |
| 7,928,796 B2 | 4/2011 | Namekawa |
| 8,223,576 B2 * | 7/2012 | Yang ................... G11C 11/4074 365/189.07 |
| 8,400,212 B1 * | 3/2013 | Nguyen ................... H02M 3/07 327/536 |
| 8,436,675 B2 | 5/2013 | Chen |
| 2009/0261890 A1 * | 10/2009 | Fifield .................... H02M 3/07 327/536 |
| 2011/0156819 A1 | 6/2011 | Kim et al. |
| 2011/0204959 A1 * | 8/2011 | Sousa ..................... H02M 3/07 327/536 |
| 2012/0105140 A1 | 5/2012 | Maejima |
| 2012/0153910 A1 * | 6/2012 | Bulzacchelli ........... G05F 1/575 323/272 |
| 2013/0076432 A1 | 3/2013 | Nguyen et al. |

* cited by examiner

US 9,341,655 B2

CHARGE PUMP GENERATOR WITH DIRECT VOLTAGE SENSOR

DOMESTIC PRIORITY

This application is a continuation of and claims priority from U.S. patent application Ser. No. 13/975,904, filed on Aug. 26, 2013, entitled "CHARGE PUMP GENERATOR WITH DIRECT VOLTAGE SENSOR", the entire contents of which are incorporated herein by reference.

BACKGROUND

The present invention relates to computer systems and, more particularly, relates to integrated circuit chips including central processing units, microprocessors, memory arrays, system-on-a-chip, programmable system-on-a-chip, and other types of integrated circuit chips.

Modern computer processors and memory chips include millions of transistors that require gate currents to switch the transistors on and off to either store or retrieve data bits encoded by the transistors. Maintaining optimal switching speed requires that adequate charge supported by the appropriate voltage be available at all times. One or more centralized capacitor systems known as charge pumps (or charge pump generators) are utilized to supply the required charge, as needed, for switching millions of transistors on a particular chip or set of chips, such as a CPU or memory array. As the charge in the capacitor is drained by transistor switching, the voltage supplied by the capacitor begins to drop indicating the need to recharge the capacitor. The charge pump continually senses the capacitor voltage and periodically recharges the pump capacitor, as needed, to maintain the charge supply stored by the pump capacitor.

A water tower is a good analogy for the charge pump system, where the water stored in the tank is analogous to the electric charge stored in the pump capacitor. Transistor switching is analogous to use of the stored water by the community and the water pressure caused by the volume of water stored in the tank is analogous to the voltage. The flow of water at a local faucet is analogous to the gate current switching an individual transistor, where the state of a glass of water filled (and for this example also capable of being emptied) by the faucet might represent a data bit. The charge pump is analogous to the tank filling system, which continually monitors the water level or pressure in the tank and periodically refills the tank to ensure that an adequate supply of water remains in the tank.

SUMMARY

Embodiments are directed to a method for a charge pump that supplies switching current for a plurality of transistors includes a capacitor generating a pumped voltage. A method for supplying switching current to a plurality of transistors includes turning on and off a charging capacitor of a charge pump based on a difference between a comparison voltage and a reference voltage, providing a feedback connection from a differential op-amp output to a current source, and receiving a feedback signal at a first end of a sensor resistor reflecting the pumped voltage. The method also includes generating a comparison voltage representative of the pumped voltage as the pumped voltage experiences a voltage drop resulting from depletion of electric charge stored by the charging capacitor, driving a sensor current to cause a voltage drop across the sensor resistor to remain constant as the pumped voltage experiences the voltage drop, and turning on charging of the charge pump capacitor in response to detecting that the pumped voltage has dropped to a threshold level below a set point voltage by detecting that the comparison voltage has dropped to a threshold level below a reference voltage. The method also includes turning off charging of the charge pump capacitor in response to detecting that the pumped voltage has returned to the set point voltage by detecting that the comparison voltage has returned to the reference voltage.

Additional features and advantages are realized through the techniques of the present invention. Other embodiments and aspects of the invention are described in detail herein and are considered a part of the claimed invention. For a better understanding of the invention with the advantages and the features, refer to the description and to the drawings accompanying figures.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
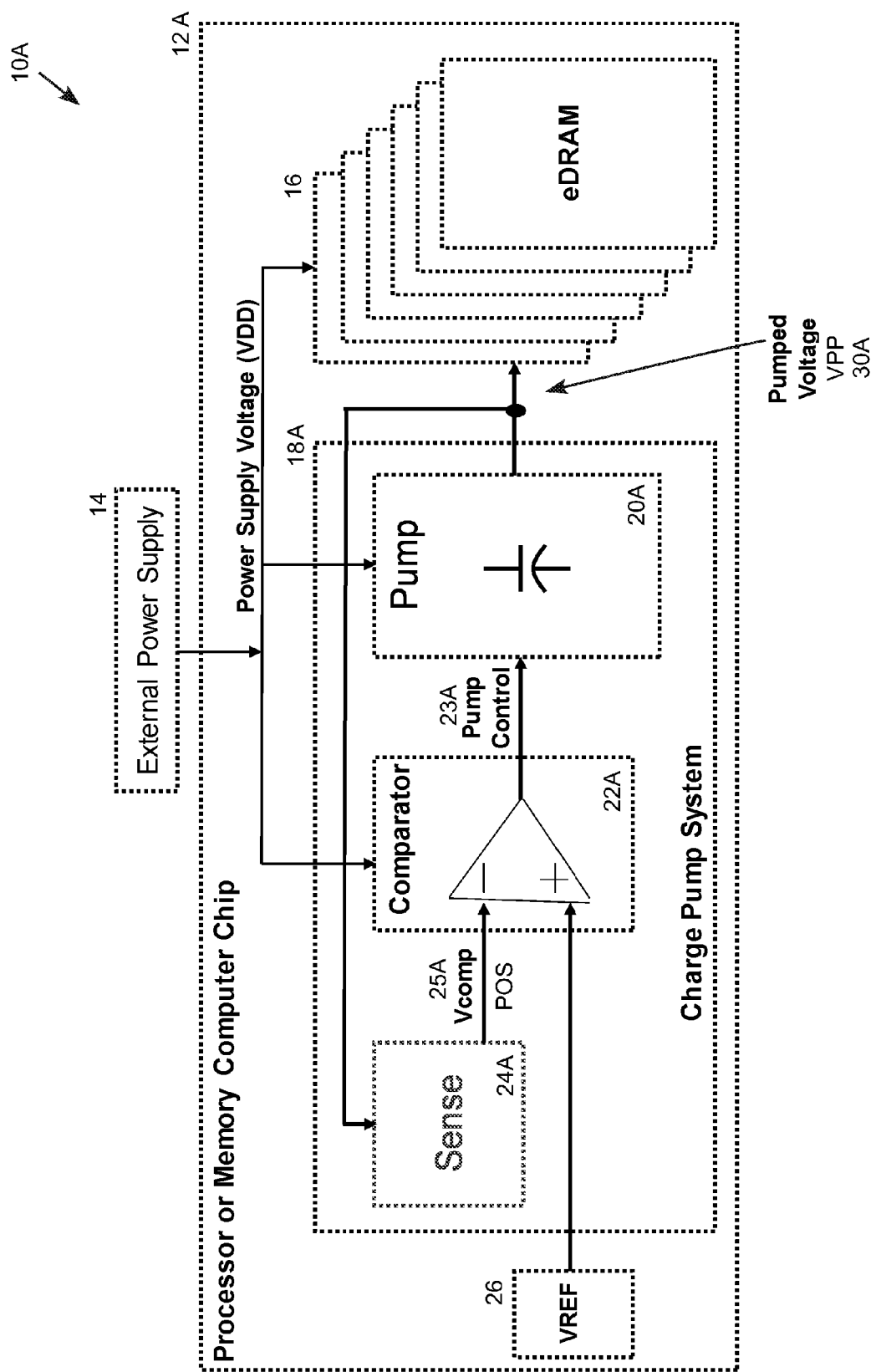
FIG. 1 is a block diagram of a computer circuit utilizing a charge pump generator with a positive voltage sensor controlling a positive pumped voltage.

Embodiments of the present invention may be realized in a direct voltage sensor for a charge pump generator supplying transistor switching charge for a computer circuit and, in particular, is well suited to configuration as part of the circuitry resident on an integrated circuit chip, such as a computer chip implement a central processing unit (CPU) or other microprocessor, memory array, system-on-a-chip, programmable system-on-a-chip, and any other type of integrated circuit. For example, the direct voltage sensor may be deployed in connection with charge pump generators on high speed, very large scale integrated circuit processor and memory chips sold by International Business Machines, Inc. (IBM).

Embodiments of the present invention may also be utilized with computer circuits including computer chips with large numbers of silicon transistors driven by charge pump generators and, more specifically, with charge pump generators resident on integrated circuit chips, such as microprocessors and memory arrays.

With respect to the above described charge pump system, any significant drop in the voltage provided by the charge pump capacitor tends to slow the transistor switching speed, which in turn adversely affects the performance of the host processor or memory array. Because transistors can, in fact, be quite sensitive to drops in gate voltage, charge pumps have been designed to closely monitor and control the switching power supply voltage, which is typically denoted as VPP. In some systems, transistors utilize positive voltage to switch to a first state (which can represent the "on" state or "data bit one") and a negative voltage to switch to the opposing state (e.g., which can represent the "off" state or "data bit zero"). Charge pumps have therefore been designed generate and regulate a negative switching voltage commonly known as VWL in addition to the positive pumped voltage VPP.

In a typical integrated circuit, for example, VPP may have a desired set point value of 1.6 Volts and VWL may have a desired set point value of −0.4 Volts. The charge pump switches on and off to keep the power supply voltages near theses values. To provide a simple example to illustrate the capacitor charging operation, the charge pump may be set to switch on when the sensor detects that VPP had dropped 1.5 Volts (i.e., a voltage drop threshold of 0.1 V), and then switch off when VPP has been restored to the set point value of 1.6 Volts. The negative switching voltage VWL operates analogously and, for this reason, only the positive pumped voltage VPP may be described in the examples below. It will nevertheless be understood that the charge pumps for both VPP and VWL operates as described in the examples and that a charge pump system may include a positive charge pump, a negative charge pump, or a dual charge pump may include both positive and negative charge pumps. It should also be understood that the voltage drop threshold may be set to any desired value including zero, which may be the preferred configuration to effectively set the voltage drop threshold to the sensitivity of the comparator. With a zero threshold, the sensitivity of the comparator, inherent delay of the movement of charge through the circuit, and the clock rate will continuously maintain the pump voltage at the maximum level within the physical limitations of the system. While this may be the preferred operation mode in practice, the non-zero voltage drop threshold of 0.1 V has been used in the example shown in FIGS. 5-6 for descriptive convenience is describing the operation of the circuit.

Referring to the positive charge pump for the purpose of illustrating the principles of embodiments of the invention, controlling the charge pump voltage requires an accurate measurement of the pumped voltage VPP. Voltage sensors in prior charge pump systems have drawbacks that prevent them from providing sufficiently accurate and robust measurements of the pumped voltages VPP. For example, resistor divider voltage sensing does not maintain a 1:1 ratio between the pumped voltage and the sensed voltage (i.e., the fraction of VPP measured with a resistor divider type sensor). Sensing the pumped voltage with a resistor divider can also produce inaccuracies caused by differences between positive and negative power supply voltages. To avoid these problems, certain charge pump systems have been designed to sense the pumped current rather than the pumped voltage. Current sensing, however, is highly sensitive to mismatches in the pumped current that are not always properly attributed to changes in the capacitor charge.

Embodiments of the present invention overcome these problems through a direct voltage sensing technique for a charge pump system that utilizes a feedback controlled differential op-amp and a resistor ladder to obtain an accurate and stable direct measurement of the pumped voltage. Unlike prior pumped voltage sensors using resistor dividers, the feedback controlled op-amp eliminates the effect of changes in the magnitude of the pumped voltage itself on the measurement of that voltage to provide a directly sensed representation of the pumped voltage. In addition, unlike prior current sensing techniques, the present approach removes any mismatch in the current by sensing the voltage drop of the feedback resistor directly and calibrating it, thereby avoiding attributing any mismatches or other irregularities in the sensing current to the voltage of the pump capacitor.

Dual direct voltage sensors may be implemented for positive VPP and negative VWL pumped voltages. Both the positive and negative direct voltage sensors may utilize the same reference voltage, if desired, which results in the positive and negative charge pumps each responding to the same threshold change from their respective set point voltage. In addition, the direct voltage sensors can be readily implemented directly on a host chip (typically a microprocessor or memory chip) through embedded silicon elements without the need for external electronic components other than the external power supply. Embodiments of the invention therefore provide a low cost, easily manufactured, electrically efficient, and highly reliable solution overcoming the problems encountered with prior sensors for charge pump systems.

With reference now to FIG. 1, an illustrative host computer system 10A includes a computer circuit 12A, such as a microprocessor or memory chip, with an external power supply 14, an electronic memory 16 such as number of eDRAM volumes, and a charge pump system 18A. In this example, the charge pump system 18A supplies a positive pumped voltage VPP 30A to the memory 16, which typically contains millions of individual transistors utilizing the charge stored in the charge pump system 18A to supply the switching (gate) current to change the states of the transistors. The charge pump system 18A includes a charge pump capacitor 20A to supply the switching current to the electronic memory 16. It will be appreciated that the charge pump capacitor 20A is typically implemented by a large number of commonly controlled silicon capacitors configured on the host computer chip effectively forming a single pump capacitor for operational purposes. A comparator 22A generates a pump control signal 23A which turns on and off charging of the pump capacitor 20A.

That is, the pump capacitor 20A is charged (i.e., a charging current is supplied to the pump capacitor) when the pump control signal 23A is set to an "on" state and not charged (i.e., no charging current is supplied to the capacitor) when the pump control signal 23A is set to an "off" state. The comparator 22A turns "on" (causing the pump capacitor 20A to charge) when the difference between a comparison voltage Vcomp_pos 25A and a reference signal VREF 26 exceeds a turn-on threshold value, in this example set to 0.1 V. The comparator 22A then turns "off" (causing the pump capacitor 20A to stop charging) when the difference between the comparison voltage signal Vcomp_pos 25A and the reference signal VREF 26 reaches a turn-off threshold value typically, in this example set to zero (i.e., Vcomp_pos 25A reaches the value of VREF 26).

The novel direct sensing technique resides in the sensor 24A which senses a representation of the voltage applied by the pump capacitor 20A to produce the sensed comparison voltage Vcomp_pos 25A. To do so, the sensor 24A receives a feedback signal representing the pumped voltage VPP 30A supplied by the capacitor 20A to the memory array 16. Further details of the sensor 24A are described below with reference to FIGS. 4A-B, 5 and 6. Before addressing those details, however, it should be appreciated that FIG. 1 shows a charge pump system 18 that produces a positive pumped voltage VPP 30A. A similar charge pump system can be used to produce a negative pumped voltage VWL, as described with reference to FIG. 2. The charge pump system 18 may also include dual pumps producing both a positive pumped voltage VPP and a negative pumped voltage VWL as described with reference to FIG. 3.

Figure 2:
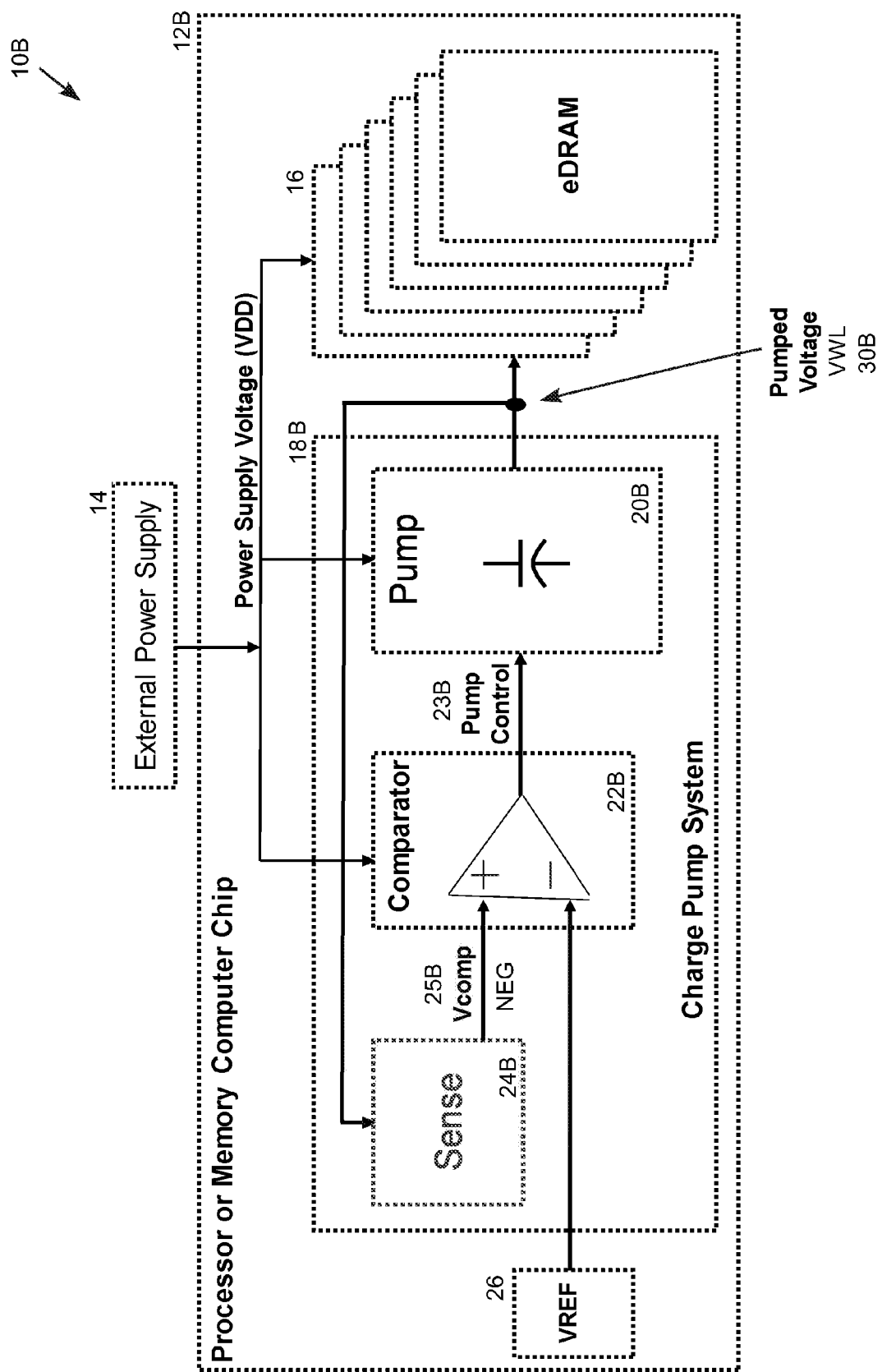
FIG. 2 is a block diagram of a computer circuit utilizing a charge pump generator with a negative voltage sensor controlling a negative pumped voltage.

FIG. 2 is a block diagram of an illustrative host computer system 10B that includes a computer circuit 12B, which is similar to the computer circuit 10A shown in FIG. 1 except that the charge pump system 18B produces a negative pumped voltage VWL 30B. The capacitor 20B stores the charge to produce the negative pumped voltage, which is controlled by a pump control signal 23B generated by a comparator 23B. The direct voltage sensor 24B produces a comparison voltage signal Vcomp_neg 25B using a feedback signal representing the negative pumped voltage VWL 30B. The comparator 23B also receives the reference signal VREF 26. The charge pump system 18B operates analogously to the charge pump system 18A, turning on and off charging of the pump capacitor 20B to regulate the negative pumped voltage VWL 30B near the desired set point voltage, in this example set to −0.4V.

Figure 3:
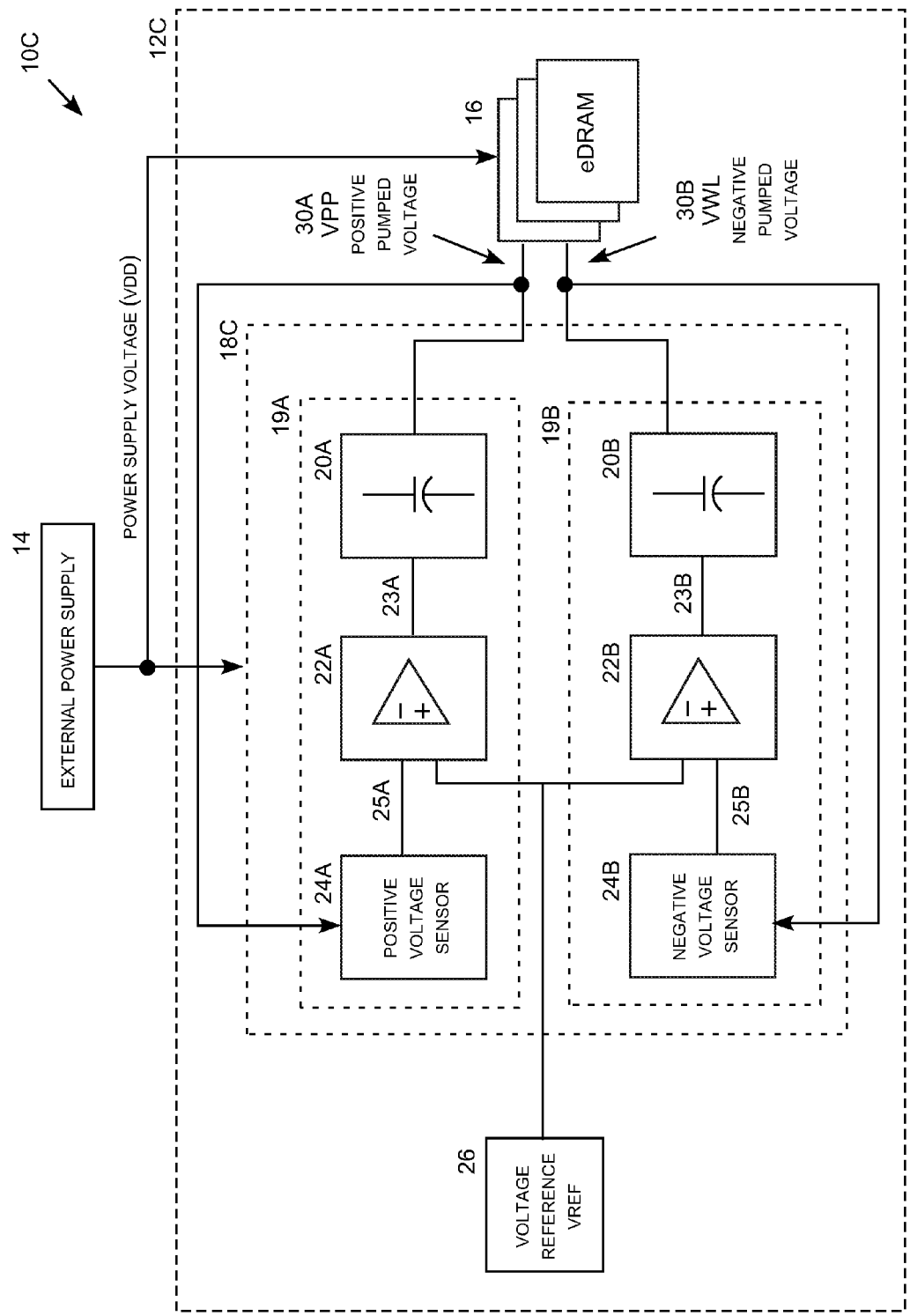
FIG. 3 is a block diagram of a computer circuit utilizing positive and negative charge pump generators with voltage sensors controlling positive and negative pumped voltages.

FIG. 3 is a block diagram of an illustrative host computer system 10C including a computer circuit 12C with a dual charge pump system 18C that generates both a positive pumped voltage VPP 30A and a negative pumped voltage VWL 30B. The dual charge pump system 18C therefor includes a positive charge pump 19A with the elements of the charge pump 18A shown in FIG. 1 and a negative charge pump 19B with the elements of the charge pump 18A shown in FIG. 2. The negative voltage sensor 24B operates according to the same principles as the positive voltage sensor 24A, which is described in greater detail below. Each charge pump 19A-B may have its own reference voltage supply, or they may both use the same reference VREF 26 as shown in FIG. 3.

Figures 4A, 4B:
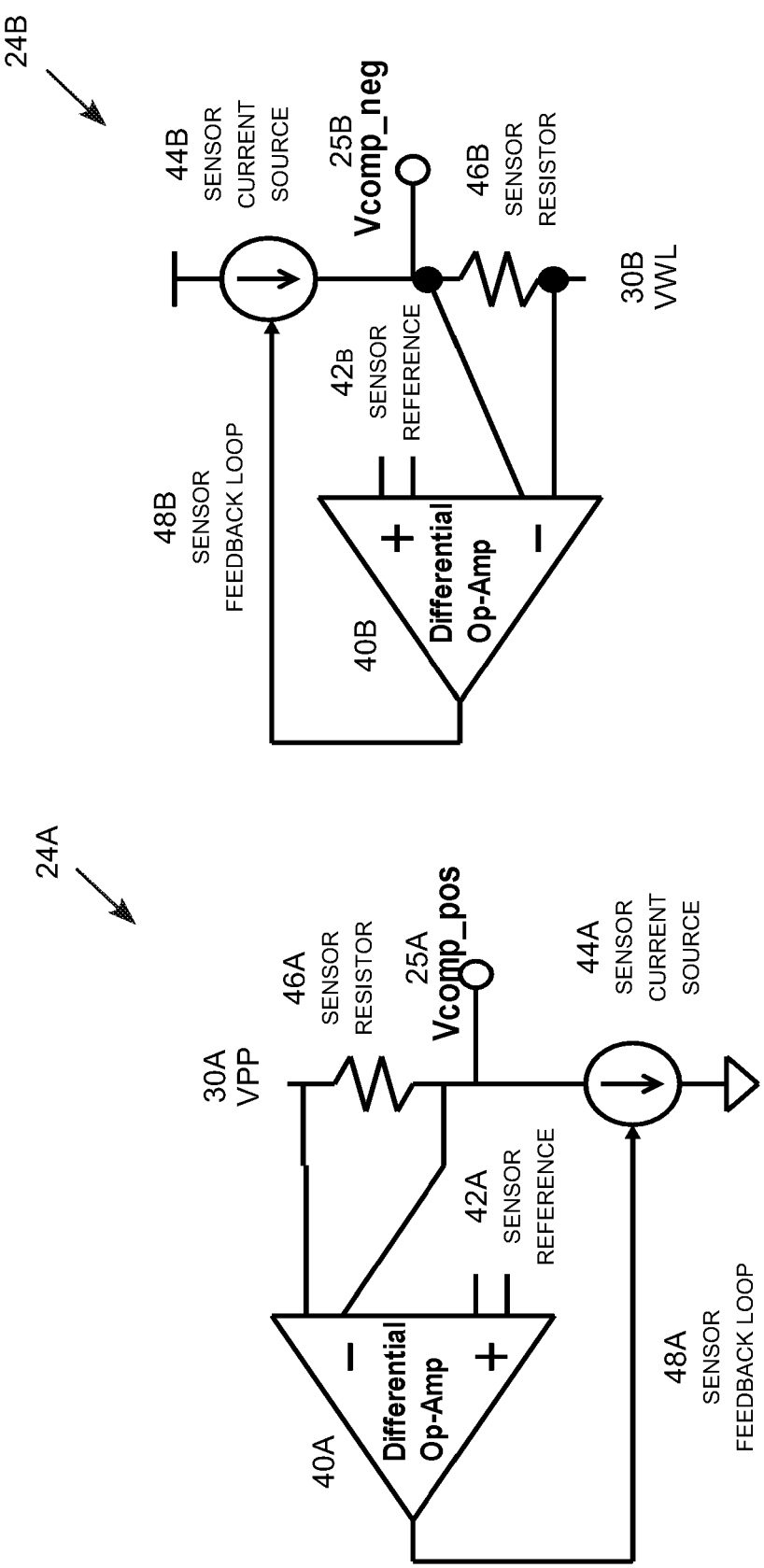
FIG. 4A is a block diagram of the positive direct voltage sensor of FIG. 3 for the positive pumped voltage.
FIG. 4B is a block diagram of the negative direct voltage sensor of FIG. 3 for the negative pumped voltage.

FIG. 4A is a block diagram of the positive direct voltage sensor 24A, which receives the feedback signal representing the positive pumped voltage VPP 30A at the top of a sensor resistor ladder 46A. The direct voltage sensor 24A includes a differential op-amp 40A that receives a voltage drop across the sensor resistor 46A at a first input port and a sensor reference voltage 42A at a second input port. The op-amp 40A controls a current source 44A, which drives a current through the sensor resistor 46A. More specifically, the op-amp 40A produces a feedback control signal 48A that regulates the current source 44A to cause the voltage across the sensor resistor 46A to remain equal to the sensor reference voltage 42A regardless of the value of VPP 30A applied to the top of the sensor resistor ladder 46A. This drives the comparison voltage Vcomp_pos 25A at the opposing side of the sensor resistor ladder 46A to a comparison voltage value that is a known constant (i.e., the sensor reference voltage 42A) below the positive pumped voltage VPP 30A. Since the voltage drop across the sensor resistor 46A remains fixed regardless of the value of VPP 30A, the comparison voltage value Vcomp_pos 25A produces at the sensor output directly senses the pumped voltage VPP 30A regardless of the magnitude of the value of VPP 30A itself. As a result, the voltage comparison value Vcomp_pos 25A is a "directly sensed" voltage that does not vary proportionally with magnitude of VPP 30A itself, as the sensed value does in resistor divider type sensors. In addition, since the direct voltage sensor 24A does not rely on a mirroring of current as it does in previous current sensing sensors, the sensor measurement is isolated from current variations due to mismatches reflected in the sensor current that may not necessarily be attributable to the level of charge in the pump capacitor 20A.

FIG. 4B is a block diagram of the negative direct voltage sensor 24B for the negative pumped voltage VWL 30B, which is similar in construction and operation to the positive direct voltage sensor 24A. Thus, the differential op-amp 40B receives a voltage drop across the sensor resistor 46B at a first input port and a sensor reference voltage 42B at a second input port. The op-amp 40B controls the current source 44B, which drives the current through the sensor resistor 46B. The op-amp 40B produces a feedback control signal 48B that regulates the current source 44B to cause the voltage across the sensor resistor 46B to remain equal to the sensor reference voltage 42B regardless of the value of VWL 30B applied to the sensor resistor 46B. This drives the comparison voltage Vcomp_neg 25B at the opposing side of the sensor resistor 46B to a value that is a known constant (i.e., the sensor reference voltage 42B) above the negative pumped voltage VWL 30B. Since the voltage drop across the sensor resistor 46B remains fixed regardless of the magnitude of VWL 30B, the sensor output Vcomp_neg 25B "directly senses" VWL 30B regardless of the magnitude of the value of VWL 30B itself. As a result, Vcomp_neg 25B does not vary proportionally with the pumped voltage VWL 30B as it does in resistor divider type sensors. And the direct voltage sensor 24B does not rely on a mirroring of current as it does in current sensing sensors.

Figure 5:
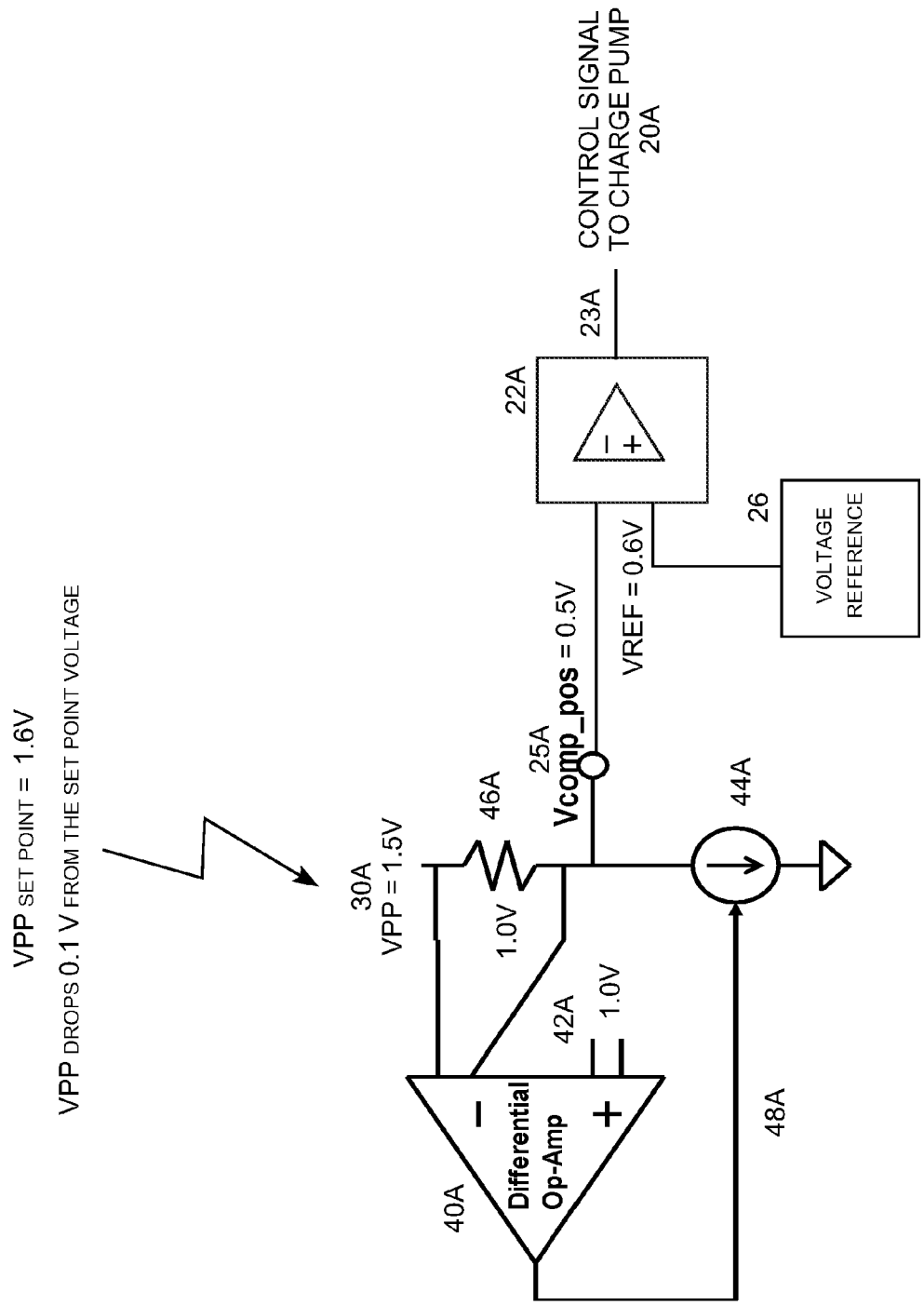
FIG. 5 is a block diagram showing an example in which a low directly sensed positive voltage switches on the positive charge pump.
Figure 6:
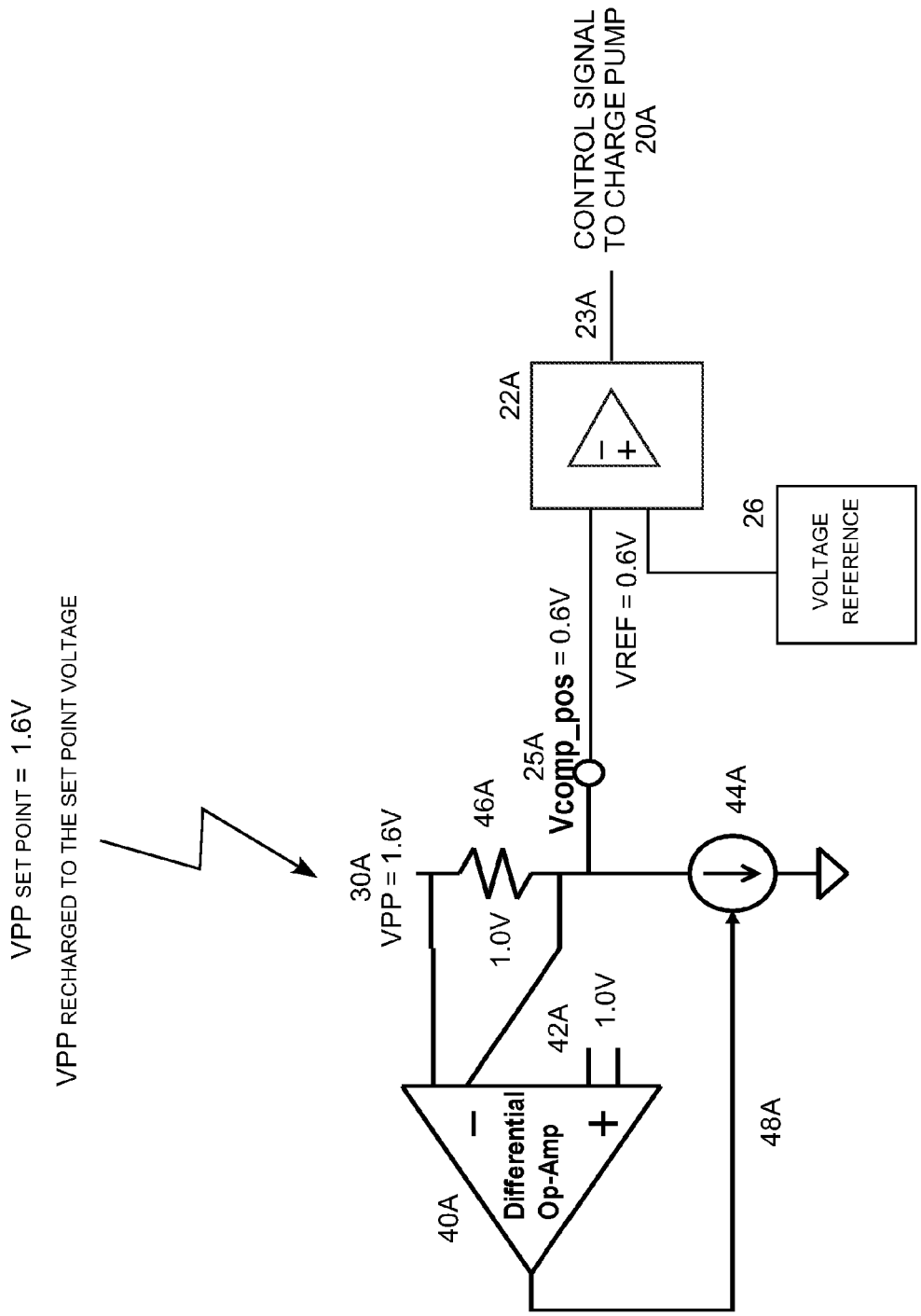
FIG. 6 is a block diagram showing a continuation the example in which the positive charge pump is switched off after the charge pump has restored the directly sensed positive voltage.

FIGS. 5 and 6 provide a specific numeric example to illustrate the operation of the direct voltage sensor. Only the positive voltage sensor 24A will be described in the example as the negative voltage sensor 24B operates analogously. In this example, the desired set point for the pump voltage VPP is 1.6 V, the pumped voltage turn-on threshold at which the charge pump turns on is 1.5 V (i.e., the capacitor voltage drop threshold is 0.1 V), and the sensor reference voltage is 1.0 V. In other words, the pumped voltage turn-on threshold is set to 1.5 V for this example, which corresponds to a comparison voltage turn-on threshold of 0.5 V, and a 0.1 V differential at the comparator 22A. FIG. 5 is a block diagram showing the first example, in which the directly sensed positive voltage VPP turns on charging of the positive charge pump. Capacitor charging turns on when VPP drops to the turn-on threshold level of 1.5 V appearing at the top of the resistor ladder 46A. As the sensor reference voltage 42A is set to 1.0 V, the op-amp 40A adjusts the feedback control signal 48A to drive the current sensor 44A to produce a voltage drop of 1.0 V across the sensor resistor 46A (i.e., equal to the sensor reference voltage 42A). This drives the sensor output indicating the comparison voltage Vcomp_pos 25A to a value of 0.5 V (i.e., Vcomp_pos=VPP (1.5 V) less the op-amp driven voltage drop (1.0 V) across the sensor resistor 46A). As a result, the comparison voltage Vcomp_pos 25A remains equal to a fixed amount (i.e., the setting of the reference voltage 42A, which is 1.0 V in this example) below VPP regardless of the magnitude of VPP itself. The comparison voltage Vcomp_pos 25A is then supplied to the comparator 22A, which turns on charging of the pump capacitor 20A when the Vcomp_pos 25A reaches the comparison turn-on threshold value, in this example 0.5 V (i.e., the differential threshold amount of 0.1 V below VREF voltage of 0.6 V, representing a drop in VPP from the set point value of 1.6 V to the pumped voltage turn-on threshold value of 1.5 V.

FIG. 6 is a block diagram showing a continuation of the preceding example in which the positive charge pump is switched off after the comparison voltage Vcomp_pos 25A has been restored to 0.6 V reflecting that the pumped voltage VPP 30A has been restored to the set point voltage of 1.6 V. That is, charging of the pump capacitor 20A continues until the pump capacitor 20A regains its desired set point value for VPP=1.6 V, which corresponds to a directly sensed comparison voltage Vcomp_pos 25A=0.6 V. In other words, the pumped voltage turn-off threshold is set to 1.6 V for this example, which corresponds to a comparison voltage turn-off threshold of 0.6 V, and a zero differential at the comparator 22A. This occurs when VPP 30A reaches the values 1.6 V because the feedback controlled op-amp 40A causes the voltage drop across the sensor resistor 46A to remain at 1.0 V even though the magnitude of VPP changes as the pump capacitor 20A is recharged. Recharging the pump capacitor 20A until the value of Vcomp_pos 25A reaches 0.6 V (corresponding to VPP=1.6 V less the fixed voltage drop of 1.0 V across the sensor resistor 46A) drives the differential across the comparator 22A to zero, which causes the comparator to discontinue charging of the pump capacitor. As a result, capacitor charging turns on whenever the pumped voltage VPP drops by the 0.1 V threshold reflecting that VPP has drops from 1.6 V to 1.5 V (as represented by Vcomp_pos dropping from 0.6 V to 0.5 V, producing a differential of 0.1 V across the comparator 22A). Capacitor charging then turns off once the pumped voltage VPP becomes equal to or exceeds its set point value of 1.6 V (as represented by Vcomp_pos being restored from 0.5 V to 0.6 V, producing a differential of zero across the comparator 22A). Of course, this numeric example is merely illustrative and other set points and thresholds may be established as a matter of design choice.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein illustrate just one example. There may be many variations to these diagrams or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for supplying switching current to a plurality of transistors, the method comprising:
    turning on and off a charging capacitor of a charge pump based on a difference between a comparison voltage and a reference voltage;
    providing a feedback connection from a differential op-amp output directly to a current source;
    receiving a feedback signal directly from a first end of a sensor resistor that provides an electrical path to deliver the pumped voltage that is applied to an opposite second end of the sensor resistor;
    generating a comparison voltage representative of the pumped voltage as the pumped voltage experiences a voltage drop resulting from depletion of electric charge stored by the charging capacitor;
    reducing the pumped voltage across the sensor resistor to generate a sensor resistor voltage drop across first and second input terminals of the op-amp;
    applying a sensor reference to a third input terminal of the op-amp different from the first and second input terminals, one of the first and second input terminals being connected to the current source; and
    determining via the differential op-amp a differential between a sensor reference and the sensor resistor voltage drop directly across the sensor resistor;
    driving a sensor current to cause the sensor resistor voltage drop across the sensor resistor to remain constant as the pumped voltage experiences the voltage drop;
    turning on charging of the charge pump capacitor in response to detecting that the pumped voltage has dropped to a threshold level below a set point voltage by detecting that the comparison voltage has dropped to a threshold level below a reference voltage defined by the sensor reference;
    turning off charging of the charge pump capacitor in response to detecting that the pumped voltage has returned to the set point voltage by detecting that the comparison voltage has returned to the reference voltage.

2. The method of claim 1, wherein the pumped voltage is a positive pumped voltage; further comprising the step of similarly controlling a negative pumped voltage.

3. The method of claim 2, further comprising the step of supplying a common reference voltage for controlling the positive and negative pumped voltages.

4. The method of claim 2, further comprising the step of implementing the method on an integrated circuit chip without incorporating electronic components external to the chip other than an external power supply.

5. A method for supplying switching current to a plurality of transistors, the method comprising:
    providing a charge pump for generating a pumping voltage and supplying the switching current;
    providing a comparator generating a pump control signal turning on and off a charging capacitor of the charge pump based on a difference between a comparison voltage and a reference voltage;
    providing a direct voltage sensor comprising a sensor resistor having a first end and a second end, a current source having a source input directly connected to the second end of the sensor resistor, and having a source output, the current source is configured to drive a sensor current through the sensor resistor, and a differential op-amp comprising a first input directly connected to the source input of current source and the second end of the sensor resistor, and a second input directly connected to the first end of the sensor resistor to directly receive the pumping voltage such that the differential op-amp is configured to receive a voltage drop across the sensor resistor caused by the sensor current, the differential op-amp including a third input connected to a sensor reference, wherein the differential op-amp further comprises an output reflecting a difference between voltage levels on the first and second inputs;

providing a feedback connection from the differential op-amp output directly to the current source;

receiving a feedback signal at the first end of the sensor resistor directly from the charge pump system reflecting the pumped voltage;

generating a comparison voltage representative of the pumped voltage as the pumped voltage experiences a voltage drop resulting from depletion of electric charge stored by the capacitor of the charge pump;

driving the sensor current to cause the voltage drop across the sensor resistor to remain constant as the pumped voltage experiences the voltage drop;

turning on charging of the charge pump capacitor in response to detecting that the pumped voltage has dropped to a threshold level below a set point voltage by detecting that the comparison voltage has dropped to a threshold level below a reference voltage;

turning off charging of the charge pump capacitor in response to detecting that the pumped voltage has returned to the set point voltage by detecting that the comparison voltage has returned to the reference voltage.

6. The method of claim 5, wherein the pumped voltage is a positive pumped voltage; further comprising the step of similarly controlling a negative pumped voltage.

7. The method of claim 6, further comprising the step of supplying a common reference voltage for controlling the positive and negative pumped voltages.

8. The method of claim 6, further comprising the step of implementing the method on an integrated circuit chip without incorporating electronic components to the chip other than an external power supply.

* * * * *